United States Patent
Pedersen et al.

(10) Patent No.: US 9,455,715 B2
(45) Date of Patent: Sep. 27, 2016

(54) APPARATUS FOR IMPROVING RELIABILITY OF ELECTRONIC CIRCUITRY AND ASSOCIATED METHODS

(75) Inventors: Bruce B. Pedersen, Sunnyvale, CA (US); Irfan Rahim, Milpitas, CA (US)

(73) Assignee: Alterm Corporation, San Jose, CA (US)

(*) Notice: Subject to any disclaimer, the term of this patent is extended or adjusted under 35 U.S.C. 154(b) by 0 days.

(21) Appl. No.: 13/174,599

(22) Filed: Jun. 30, 2011

(65) Prior Publication Data
US 2013/0002287 A1    Jan. 3, 2013

(51) Int. Cl.
H03K 19/177    (2006.01)
H03K 19/00    (2006.01)
H03K 19/003    (2006.01)

(52) U.S. Cl.
CPC ....... H03K 19/17752 (2013.01); *H03K 19/003* (2013.01)

(58) Field of Classification Search
CPC .......... H01L 29/7869; H01L 27/1225; H03K 19/0016; H03K 2005/00058; H03K 3/0375; H03K 19/17764; H03K 19/00338; H03K 19/00392; H03K 19/17736; G11C 11/4125; G11C 17/16; G11C 29/785

USPC ................ 326/37–47, 101, 8–16, 93, 95, 98
See application file for complete search history.

(56) References Cited

U.S. PATENT DOCUMENTS

| | | | |
|---|---|---|---|
| 5,646,544 A | 7/1997 | Iadanza | |
| 7,973,556 B1 * | 7/2011 | Noguera Serra et al. | 326/38 |
| 2006/0022711 A1 | 2/2006 | Sumita | |
| 2010/0289527 A1 * | 11/2010 | Sumita | 326/83 |
| 2011/0267107 A1 * | 11/2011 | Chern et al. | 326/121 |

FOREIGN PATENT DOCUMENTS

| | | |
|---|---|---|
| CN | 1463042 | 12/2003 |
| JP | 2002-305435 | 10/2002 |
| JP | 2009-110516 | 5/2009 |
| JP | 2009-164730 | 7/2009 |

* cited by examiner

*Primary Examiner* — Dylan White

(57) ABSTRACT

In an exemplary embodiment, an apparatus includes a first set of circuit elements and a second set of circuit elements. The first set of circuit elements is used in a first configuration of the apparatus, and the second set of circuit elements is used in a second configuration of the apparatus. The first configuration of the apparatus is switched to the second configuration of the apparatus in order to improve reliability of the apparatus.

24 Claims, 12 Drawing Sheets

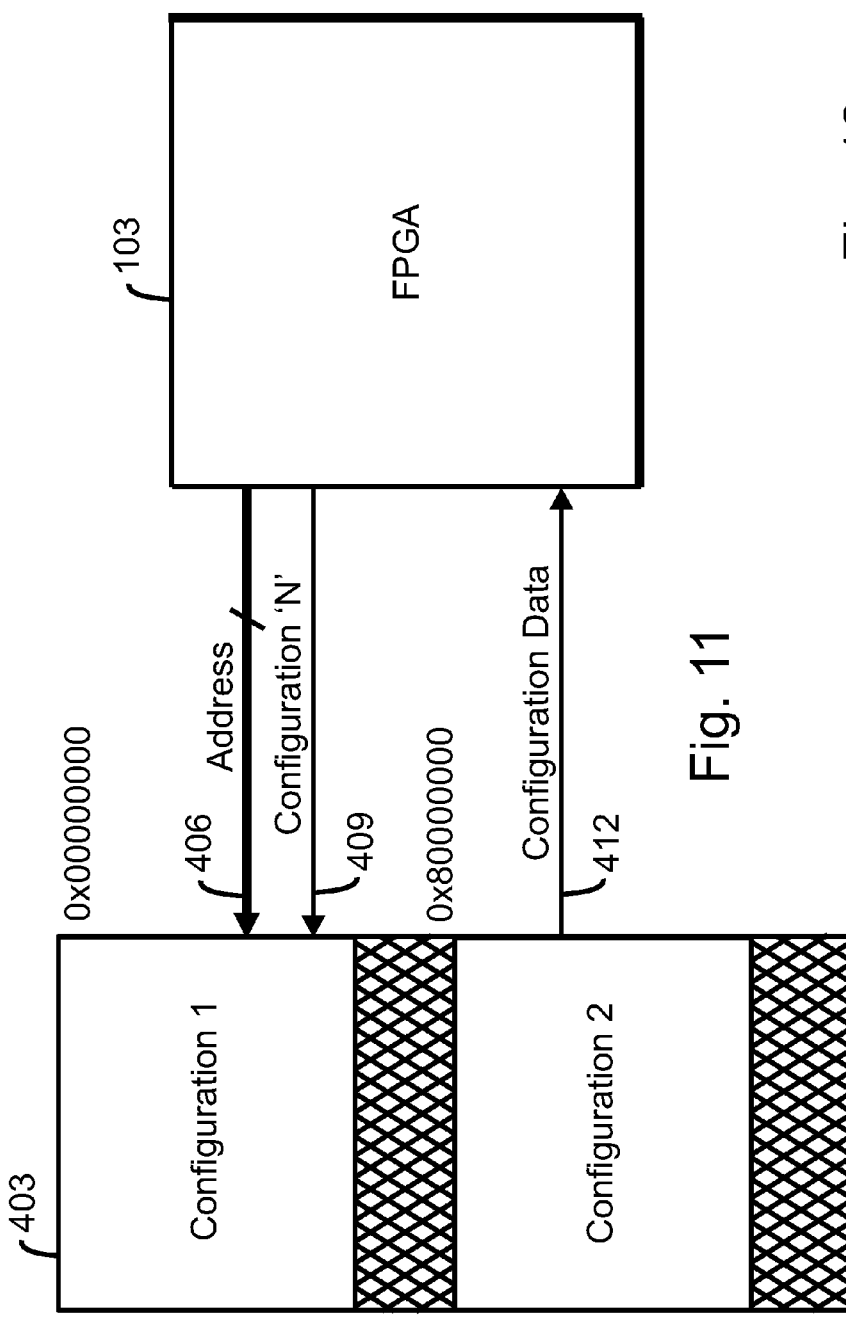
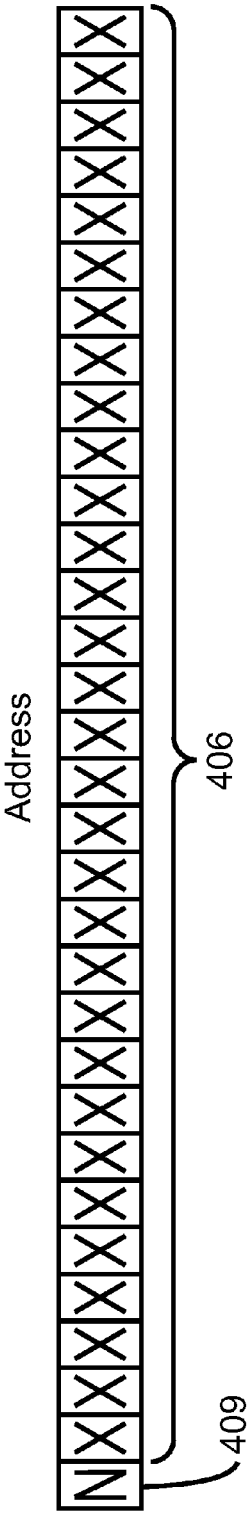

APPARATUS FOR IMPROVING RELIABILITY OF ELECTRONIC CIRCUITRY AND ASSOCIATED METHODS

TECHNICAL FIELD

The disclosed concepts relate generally to electronic circuitry and devices and, more particularly, to apparatus for improving electronic devices and circuitry such as field-programmable gate arrays (FPGAs), and associated methods.

BACKGROUND

Advances in electronics have resulted in an increasing number of functions and capabilities being realized by semiconductor devices, for example, integrated circuits (ICs). To provide those functions and capabilities, semiconductor devices, such as ICs, continue to include an increasing number of transistors.

To reduce cost and yet meet the specifications for more functions and capabilities, semiconductor technology has continued to drive the trend towards higher device density and smaller device geometries. Those trends have affected the characteristics of semiconductor devices. For example, certain semiconductor devices tend to have different characteristics as they near the end of their lives than they do near the beginning of their lives.

SUMMARY

Apparatus and associated methods according to various embodiments improve the reliability of electronic circuitry or apparatus, such as ICs. In one exemplary embodiment, an apparatus includes two sets of circuit elements used in two configurations of the apparatus. The first set of circuit elements is used in a first configuration of the apparatus, whereas the second set of circuit elements is used in a second configuration of the apparatus. The first configuration of the apparatus is switched to the second configuration of the apparatus in order to improve the reliability of the apparatus.

In another exemplary embodiment, a method includes operating an IC in a first configuration by using a first set of circuit elements allocated to the first configuration, and operating the IC in a second configuration by using a second set of circuit elements allocated to the second configuration. Operating the IC in the first configuration followed by operating the IC in the second configuration according to the method improves the reliability of the IC.

In yet another exemplary embodiment, a method of configuring an IC includes allocating a first set of circuit elements to a first configuration of the IC, and allocating a second set of circuit elements to a second configuration of the IC. The method further includes configuring the IC so that the first configuration of the IC is switched to the second configuration of the IC so as to improve the reliability of the IC.

BRIEF DESCRIPTION OF THE DRAWINGS

The appended drawings illustrate only exemplary embodiments and therefore should not be considered as limiting its scope. Persons of ordinary skill in the art who have the benefit of this disclosure appreciate that the disclosed concepts lend themselves to other equally effective embodiments. In the drawings, the same numeral designators used in more than one drawing denote the same, similar, or equivalent functionality, components, or blocks.

FIGS. 11-12 show circuit arrangements for providing configuration information to an FPGA according to an exemplary embodiment.

DETAILED DESCRIPTION

Figure 1:
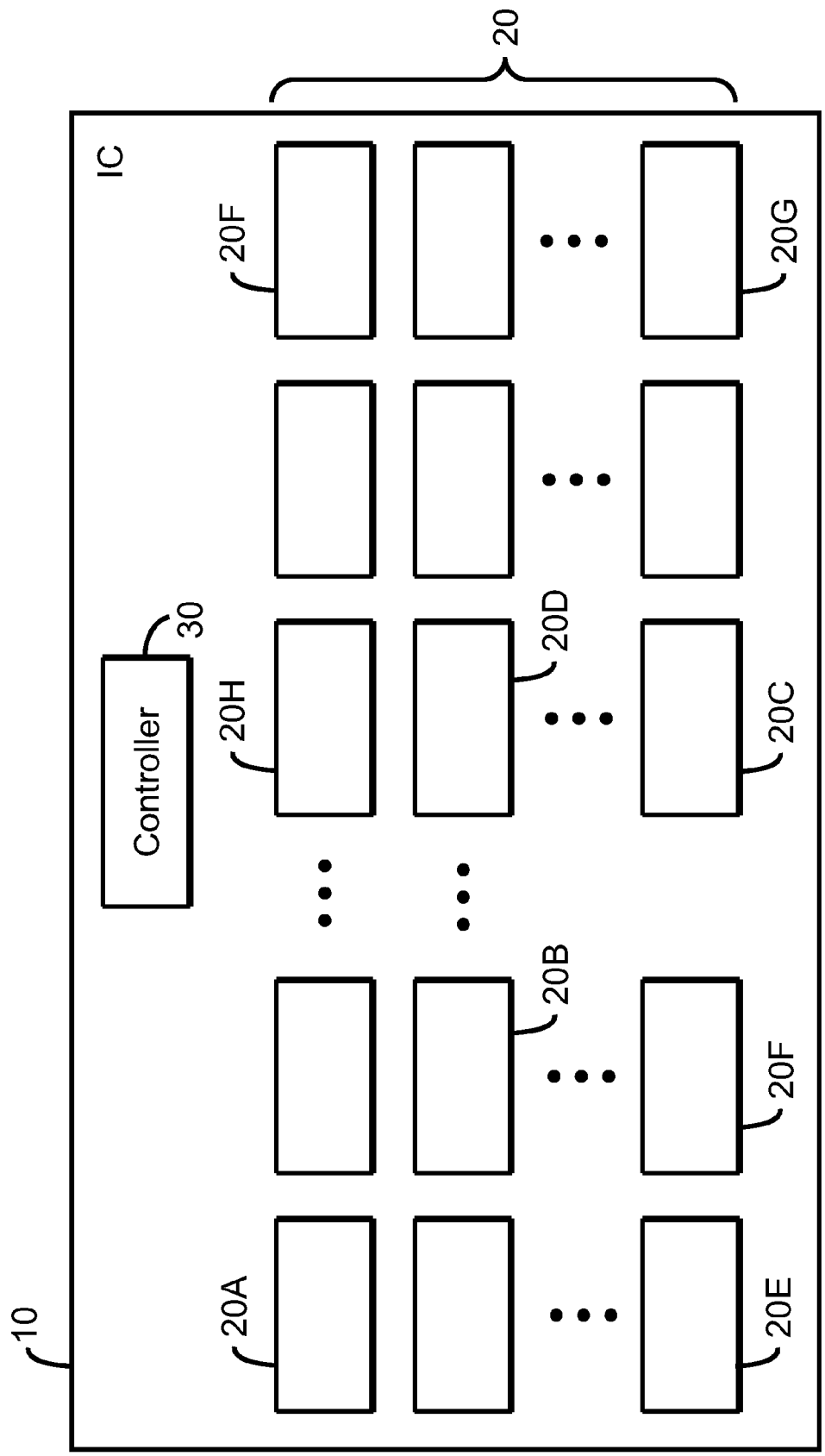
FIG. 1 illustrates a circuit according to an exemplary embodiment that includes a plurality of circuit elements for allocation to two or more configurations.

The disclosed concepts relate generally to the reliability and performance of electronic circuitry and devices, such as ICs. More specifically, the disclosed concepts provide apparatus and methods for improving the reliability of electronic circuitry or devices, for example, ICs.

Modern semiconductor fabrication technologies, such as those used to make complementary metal oxide semiconductor (CMOS) devices and ICs, have resulted in the introduction of new mechanisms or phenomena that change device (e.g., transistors, such as p-type metal oxide semiconductor (PMOS) or n-type metal oxide semiconductor (NMOS) transistors) characteristics, sometimes in relatively significant ways. Examples of such adverse phenomena known to persons of ordinary skill in the art include negative bias temperature instability (NBTI) in PMOS devices, and positive bias temperature instability (PBTI) in NMOS devices.

Other phenomena may also change device characteristics and may reduce reliability. Examples include stress (electrical, mechanical, environmental (heat, cold, etc.), and the like) and time-related phenomena, such as aging, on at least a part of the circuit, such as an IC. Some of the above phenomena may be more pronounced depending on application. For example, automotive, military or aerospace applications may subject circuitry to increased stress compared to other applications.

As a result of the above phenomena or other phenomena, device or circuit characteristics change during the lifecycle of the circuit elements such as transistors. For instance, transistors might have different characteristics at the beginning of their (or the IC's) working lives than they do near the end of their (or the IC's) working lives. The change in the device characteristics may adversely affect device reliability.

The apparatus and methods according to embodiments of the present invention provide the advantage of improving the reliability and/or life-spans of electronic circuitry and devices by reducing the effects of the above phenomena or other phenomena. Generally, this disclosure uses two or more configurations of circuit elements within a circuit, such as an IC, in order to combat the effects of stress and phenomena that may adversely affect the circuit. More specifically, apparatus and methods according to exemplary embodiments switch (or rotate, replace, change, substitute, or shift) among two or more configurations, thus switching usage of circuit elements. More specifically, the circuit elements in a circuit, such as an IC are allocated to two or more sets. In one configuration, one set of circuit elements is used, e.g., is active, while some other sets of circuit elements (e.g., unused circuit elements or blocks) are inactive.

After a period of time, another configuration is used, which may cause the use of some of the previously inactive circuit elements (and in some embodiments also some of the previously active circuit elements) to become active, and vice-versa. In this manner, a configuration is switched in place of a previous configuration. This process may repeat, and a given configuration may be used for a corresponding period of time. In exemplary embodiments, the periods of time are selected to have sufficient length to allow at least some of the circuit elements corresponding to a given configuration to recover or substantially recover from the effects of stress and/or other adverse phenomena described above (e.g., return to the previous characteristics, or substantially or effectively to the previous characteristics, of the circuit elements). For example, a configuration switch may occur after a sufficiently long period of time for a previously used (e.g., just used) circuit elements to recover from NBTI and/or PBTI effects (or recover sufficiently to allow subsequent use of the circuit elements).

As persons of ordinary skill in the art understand, there may exist some phenomena from the effects of which circuit components cannot or do not recover effectively. Even in such situations, the effective life of electronic circuitry may be increased (e.g., by a factor of N, if N configurations, as described below in detail, are used).

Generally speaking, the circuit elements available or present in a circuit, such as an IC, are selected and allocated to two or more configurations. In some embodiments, spare (or extra or unused) circuit elements, i.e., more circuit elements in the overall circuitry or device than needed or used to perform the overall functionality, may be used to implement one or more additional configurations. In some other embodiments, as noted below, some of the circuit elements may be common to two or more circuit configurations.

FIG. 1 shows a circuit 10 according to an exemplary embodiment. Circuit 10 may be an IC, as shown in FIG. 1, or generally any type of circuit. Circuit 10 includes a plurality of circuit elements 20. Circuit elements 20 may constitute a wide variety of circuitry, ranging from individual transistors to circuits containing several transistors, blocks, sub-systems, etc. The level of granularity depends on factors such as the application of circuit 10, the number of circuit elements 20, etc.

Each of circuit elements 20 may realize or provide the same or a different functionality as the other circuit elements 20. Thus, in some embodiments, circuit elements 20 all provide the same, or substantially the same, functionality. In other embodiments, each of circuit elements 20 provides a different functionality than do other circuit elements 20. In yet other embodiments, some of circuit elements 20 provide the same, or substantially the same, functionality, while other circuit elements 20 provide one or more different functionalities.

Circuit 10 further includes controller 30. Controller 30 may select and allocate circuit elements 20 to two or more configurations. Alternatively, the selection and allocation of circuit elements to configuration(s) may be performed by the user, by software or firmware, and/or by other circuitry, for example, circuitry outside an IC. In either case, the configurations may be stored externally to the electronic circuitry (e.g., an IC, files communicated to the electronic circuitry), internally to the electronic circuitry (e.g., a block of circuitry in an IC, or spread within an IC). In a given configuration of circuit 10, controller 30 may cause one or more of circuit elements to be active, i.e., participate or be active in realizing the overall function of circuit 10. In other words, for a given configuration, controller 30 determines which of circuit elements 20 operate or are active to realize the overall desired functionality of circuit 10. For example, suppose that circuit elements 20 constitute logic gates, and that the desired overall functionality of circuit 20 in a multiplexer (MUX) function. Controller 30 may select and allocate several of the logic gates to be active in order to implement the desired MUX function for a given configuration.

In a given configuration, for example, an initial configuration, controller 30 selects one set of circuit elements, e.g., circuit elements 20A-20D to be active during one configuration of circuit 10 (i.e., allocated to that configuration). Thereafter, controller 30 (alone or in conjunction with some other mechanism) causes circuit elements 20A-20D to realize the desired functionality. Controller 30 keeps track of which circuit elements 20 are used for each configuration of circuit 10. Thus, in the example above, controller 30 marks (or otherwise keeps track of) circuit elements 20A-20D as being used in a configuration. Controller 30 may also keep track of how recently a set of circuit elements 20 have been used, i.e., have been active to realize at least a part of the functionality of circuit 10. After a period of time, controller 30 selects another set of circuit elements, e.g., circuit elements 20E-20G for another configuration of circuit 10, ceases to use the previous configuration, and uses the new configuration (causes circuit elements 20A-20D to become inactive, and circuit elements 20E-20G to become active), i.e., switches one configuration in place of another. In other words, in the second configuration of circuit 10, controller 30 activates circuit elements 20E-20G in place of circuit elements 20A-20D (which become inactivated). Thereafter, circuit elements 20E-20G realize at least a part of the functionality of circuit 10 in this configuration.

Controller 30 may inactivate circuit elements 20 corresponding to a given configuration in a variety of ways. In some embodiments, controller 30 may shut down or power down those circuit elements. In some embodiments, controller 30 may disable those circuit elements, for example, through the use of an enable input of the circuit elements. In other embodiments, controller 30 may cause those circuit elements to enter a sleep mode.

Controller 30 may perform the switching of configurations, i.e., switching or changing the active and inactive status of circuit elements 20 in a variety of ways. For example, in some embodiments, controller 30 may achieve the switching automatically (e.g., using a timer or some measure of the performance of active circuit elements 20A-20D, etc.). In other embodiments, controller 30 may perform the switching at least in part in response to external input to circuit 10, for example input from a user.

In exemplary embodiments, such as the example described above, the active circuit elements before the switching do not overlap with the active circuit elements after the configuration switching. Thus, in the example above, circuit elements 20A-20D do not overlap with (are different from) circuit elements 20E-20G. In other exemplary embodiments, the circuit elements before and after a configuration switch may overlap to a certain degree. In yet other exemplary embodiments, the circuit elements before and after a configuration switch may overlap, but preferably do not. In yet other exemplary embodiments, the active circuit elements before and after the configuration switch may be selected randomly or pseudo-randomly from a pool of available circuit elements.

In other exemplary embodiments, some of the circuit elements before and after the configuration switch may overlap or even be the same, but the logic values at the input(s) and/or output(s) of at least some of the circuit elements before a configuration switch is the Boolean logic opposite of the corresponding values after the configuration switch. For example, an inverter 20H before the switching may have a logic 1 input and, hence, a logic 0 output. After switching the configuration, inverter 20H is used and/or arranged by controller 30 (or another mechanism) in the overall circuit 10 such that inverter 20H has a logic 0 input and thus a logic 1 output. In some embodiments, some of the circuit elements may be active in more than one configuration, but have different Boolean logic inputs, as described above, for example.

In some embodiments, one or more additional configurations (i.e., three or more configurations of the circuit elements in the circuitry, IC, etc.) may be used. In other words, rather than have two sets of circuit elements corresponding to two configurations, one may have more than two sets of circuit elements and/or two or more configuration switchings. The number of configurations may depend on a number of factors, such as circuit complexity, the level of stresses experienced by various circuit elements, the type and/or number of spare circuit elements, the degree of overlap desired or allowed among or between configurations, and the like.

Regardless of the exact arrangement of circuit elements and overall scheme used to switch configurations, the goal of allocating the circuit elements and switching of the configurations is to reduce the effects of phenomena that adversely affect reliability and/or life-spans of circuit elements, circuitry (e.g., circuit 10), or devices, such as the phenomena described above. The reliability and/or life-spans of circuitry, such as ICs, may be improved or increased by relatively substantial amounts (e.g., doubling or tripling of life-spans in some embodiments). The increased reliability and/or life-spans result in several advantages, such as reduced cost (e.g., because of replacements), increased customer or end-user satisfaction, and/or increased suitability for relatively demanding applications (e.g., automotive, military, aerospace).

More specifically, some of circuit elements 20 (e.g., circuit elements 20A-20D in FIG. 1), which are used in a configuration of circuit 10, become active and therefore become subject to the phenomena described above. As a result, one or more characteristics of the devices in circuit elements used in the configuration may become degraded and/or the circuit elements 20 may become stressed, typically over time. After a period of time, controller 30 switches circuit 10 to a new configuration. Thus, in the above example, controller 30 causes circuit elements 20A-20D to become inactive, and circuit elements 20E-20G to become active.

The configuration switch process may repeat, as desired. Thus, in some embodiments, controller 30 may switch back to the first configuration after some period of time, then to the second configuration, and so on. In embodiments with more than two configurations, controller 30 may switch among the configurations in a variety of ways, for example, sequentially, randomly, pseudo-randomly, according to a prescribed order, etc.

According to one aspect of the disclosure, circuit 10 includes circuitry and coupling mechanisms (e.g., MUXs, demultiplexers (DEMUXs), pass transistors, switching matrices, etc.) that allow controller 30 to switch configurations of circuit 10. In other words, such circuitry and coupling mechanisms allow controller 30 to couple active circuit elements 20 in a given configuration in a manner that provides the overall desired functionality of circuit 10. Similarly, such circuitry and coupling mechanisms provide controller 30 with the capability to uncouple or inactivate other circuit elements 20 (e.g., those circuit elements used in other configurations of circuit 10), i.e., configure those circuit elements 20 so that they do not realize the functionality of circuit 10 during that particular configuration.

Figure 2:
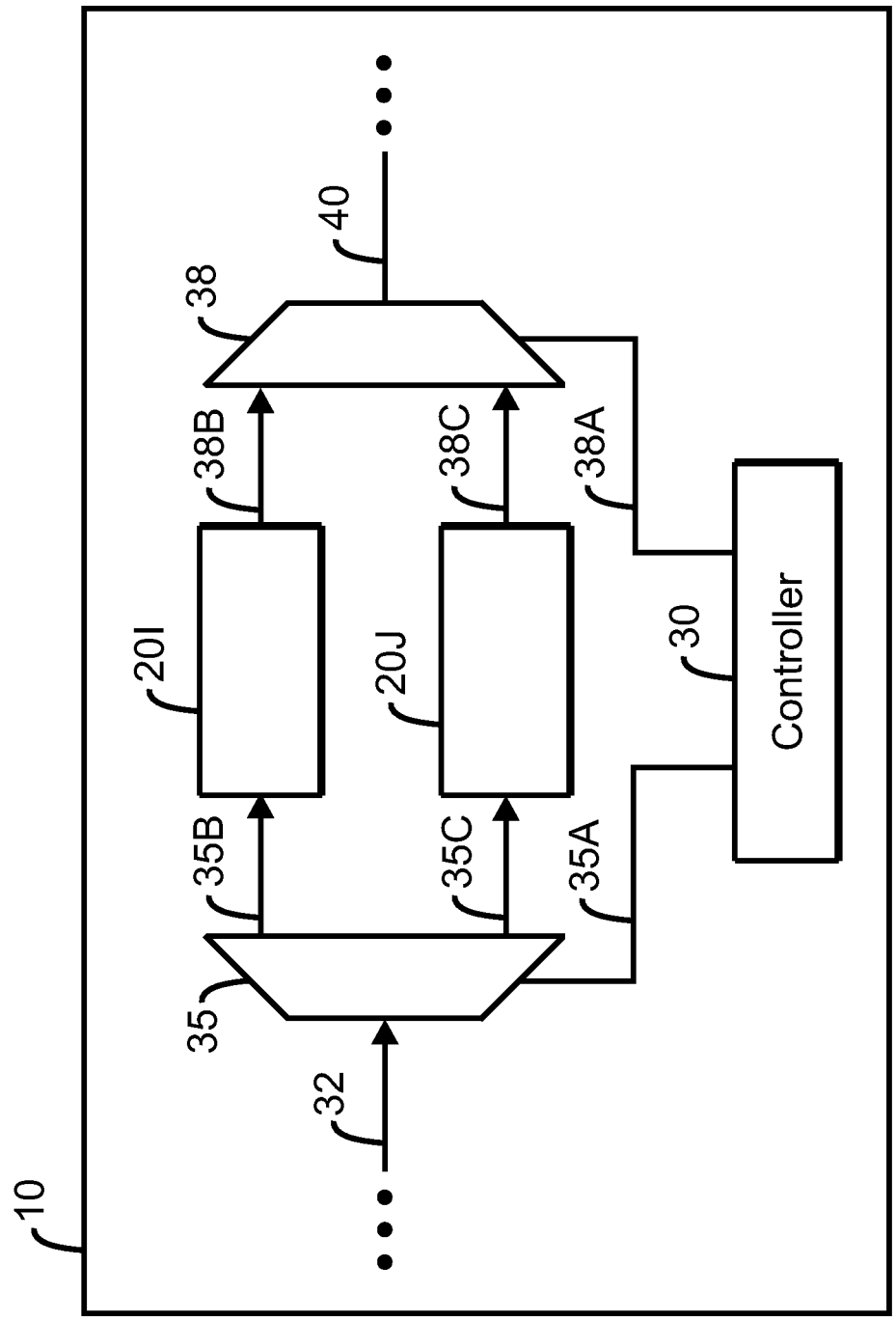
FIG. 2 depicts circuitry for switching of configurations according to an exemplary embodiment.

FIG. 2 depicts circuitry for switching configurations according to an exemplary embodiment. In this example, circuit elements 20I and 20J are active in two configurations of circuit 10, respectively (i.e., circuit element 20I may be active in one configuration, and circuit element 20J may be active in another configuration). During the first configuration, controller 30 uses control signal 35A to cause demultiplexer (DEMUX) 35 to provide an input signal 32 (e.g., an internal signal of circuit 10 or a signal external to circuit 10) to circuit element 20I. In response to signal 35B from DEMUX 35, circuit elements 20I provides an output signal 38B. Using control signal 38A, controller 30 causes MUX 38 to provide signal 38B as output signal 40 of MUX 38.

During the second (or another) configuration of circuit 10, controller 30 uses control signal 35A to cause demultiplexer (DEMUX) 35 to provide signal 32 to circuit element 20J. In response to signal 35C from DEMUX 35, circuit elements 20J provides an output signal 38C. Using control signal 38A, controller 30 causes MUX 38 to provide signal 38C as output signal 40.

Figure 3:
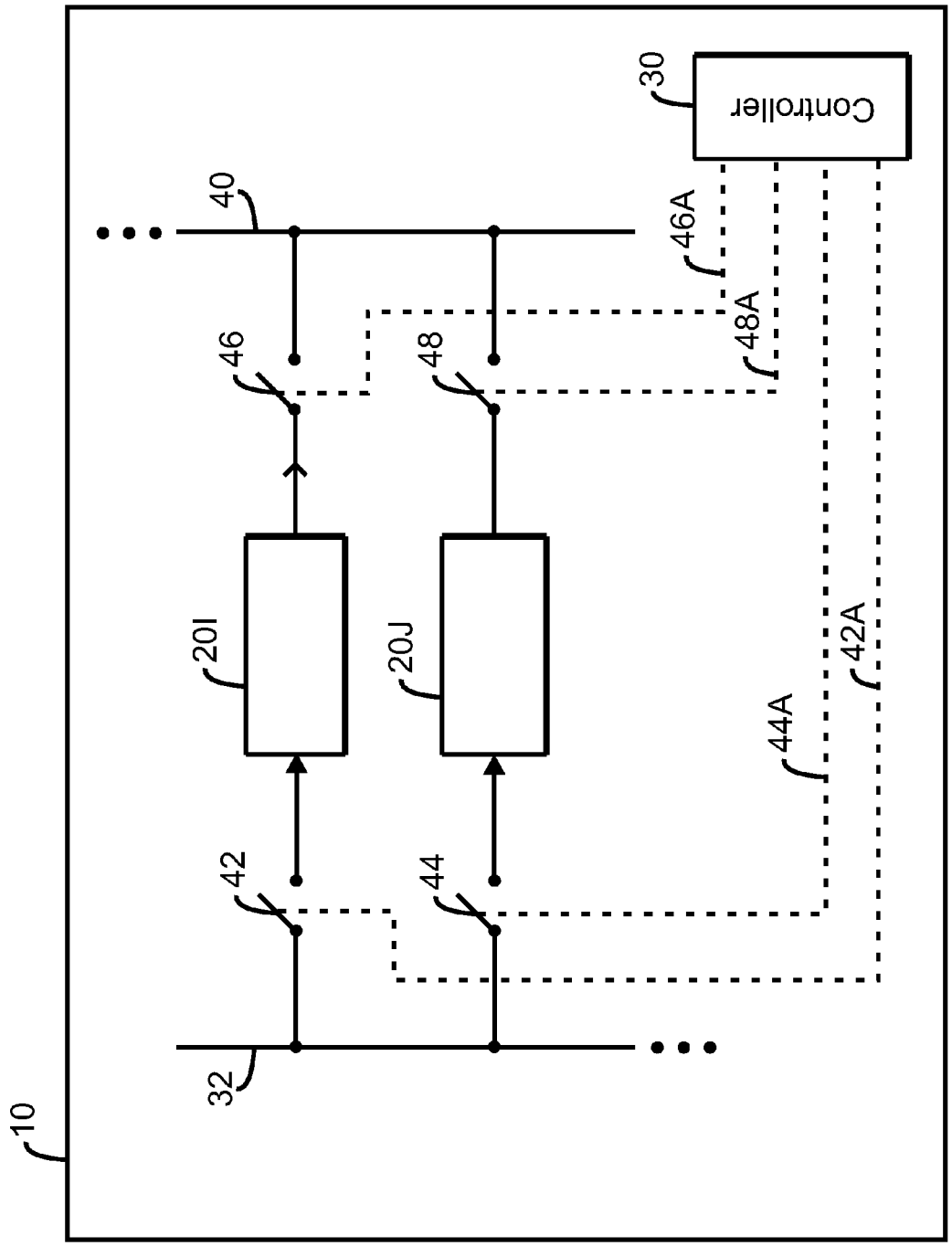
FIG. 3 shows circuitry for switching of configurations according to another exemplary embodiment.

FIG. 3 shows circuitry for switching of configurations according to another exemplary embodiment. In this embodiment, controller 30 uses signals 42A, 44A, 46A, and 48A to control, respectively, controlled switches 42, 44, 46, and 48. In response to their respective control signals, switches 42, 44, 46, and 48 may open or close, as desired. Thus, one value of signal 42A may cause switch 42 to close, while another value of signal 42A may cause switch 42 to open. Switches 44, 46, and 48 operate similarly in response to their respective control signals, i.e., control signals 44A, 46A, and 48A.

In one configuration, controller 30 uses signal 42A to cause switch 42 to close and therefore provide input signal 32 to an input of circuit element 20I. Likewise, using signal 46A, controller 30 causes switch 46 to close and provide an output signal of circuit element 20I as output signal 40. In another configuration, controller 30 uses signal 44A to cause switch 44 to close which, consequently, provides input signal 32 to an input of circuit element 20J. Similarly, using signal 48A, controller 30 causes switch 48 to close, which in turn provides an output signal of circuit element 20J as output signal 40.

As noted, a variety of circuitry and schemes for configuration switching are possible, as persons of ordinary skill in the art understand. FIGS. 2-3 provide merely two examples. Furthermore, switches 42, 44, 46, and 48 in FIG. 3 may be implemented in a variety of ways, as persons of ordinary skill in the art understand. For example, in exemplary embodiments, transistors, transmission gates, logic gates, etc., may be used.

One aspect of the disclosure relates to reducing the effects of phenomena that adversely affect reliability and/or life-spans of ICs with programmable circuitry, such as field-programmable gate arrays (FPGAs). Apparatus and methods according to the disclosed concepts provide the advantage of overcoming or reducing the adverse effects of phenomena such as NBTI, PBTI, stress, and the like, especially in FPGAs that use pass-gates or pass-transistors to implement their routing interconnect or programmable interconnect.

To apply the techniques for improving the reliability and life-spans described above to an FPGA, one may allocate various circuit blocks in the FPGA to two or more configurations, and then switch the configurations. In some embodiments, the circuit blocks may include circuitry in the fabric of the FPGA (e.g., programmable logic and/or programmable interconnect). Generally, one may treat any of the circuitry in the FPGA (or part(s) of such circuitry or multiples of such circuitry) as circuit blocks to be allocated to configurations, as described above.

Figure 4:
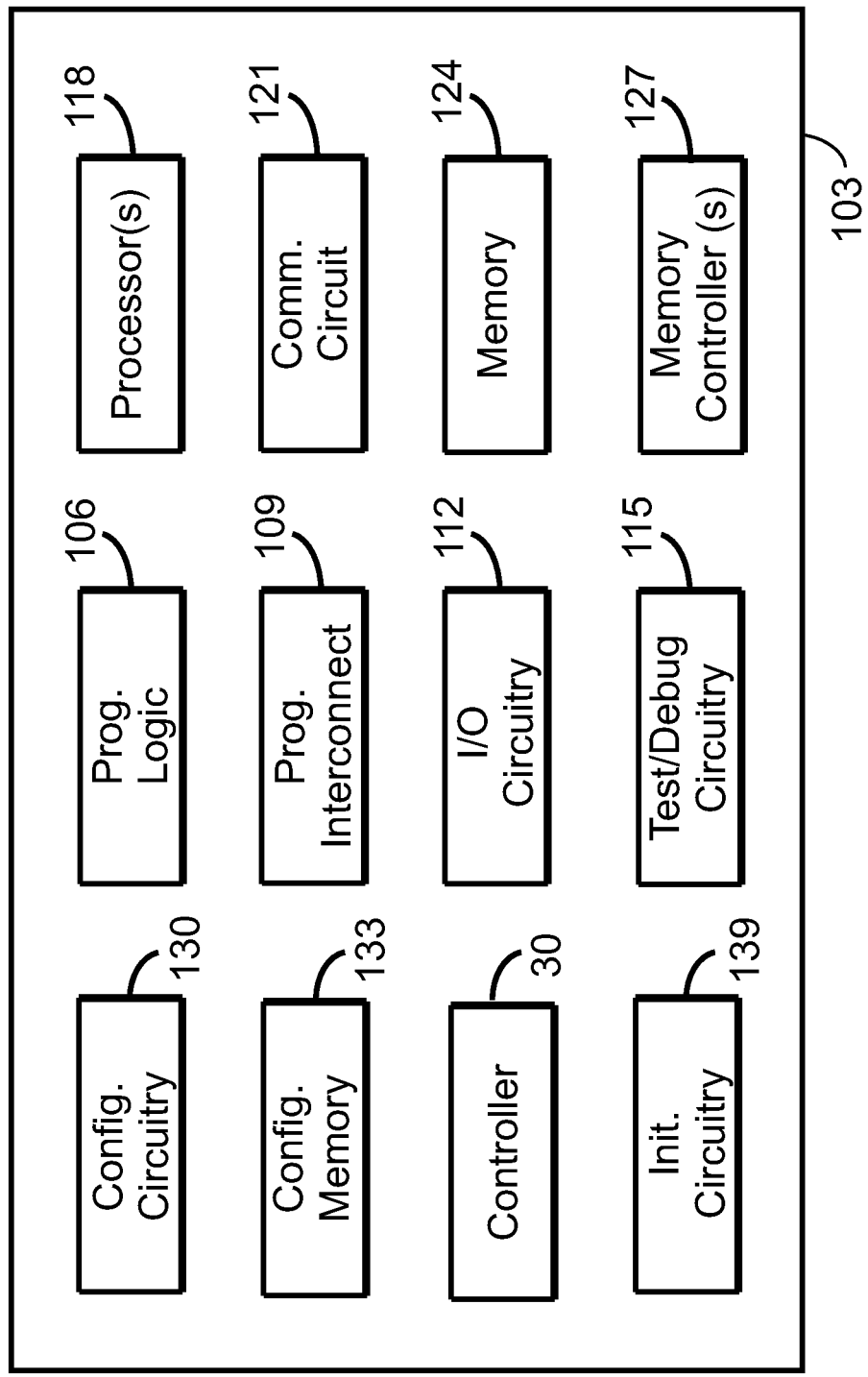
FIG. 4 illustrates a block diagram of an FPGA according to an exemplary embodiment.

FIG. 4 illustrates a general block diagram of an FPGA 103 according to an exemplary embodiment. FPGA 103 includes configuration circuitry 130, configuration memory (CRAM) 133, controller 30, programmable logic 106, programmable interconnect 109, and I/O circuitry 112. In addition, FPGA 103 may include test/debug circuitry 115, one or more processors 118, one or more communication circuitry 121, one or more memories 124, one or more controllers 127, and initialization circuit 139, as desired. Note that the figure shows a general block diagram of FPGA 103. Thus, FPGA 103 may include other blocks and circuitry, as persons of ordinary skill in the art understand. Examples of such circuitry include clock generation and distribution circuits, and the like. Furthermore, FPGA 103 may include analog circuitry, other digital circuitry, and/or mixed-signal circuitry, fuses, anti-fuses, and the like, as desired.

Programmable logic 106 includes blocks of configurable or programmable logic circuitry, such as look-up tables (LUTs), product-term logic, pass gates, multiplexers (MUXs), logic gates, registers, memory, and the like. Programmable interconnect 109 couples to programmable logic 106 and provides configurable interconnects (coupling mechanisms) between various blocks within programmable logic 106 and other circuitry within or outside FPGA 103 (for example, by using pass gates and/or MUXs). In some embodiments, programmable logic 106 and/or programmable interconnect 109 may include fuses and/or anti-fuses to provide additional flexibility or programmability.

Controller 30 controls various operations within FPGA 103, including the switching of configurations and allocation of circuit elements. Under the supervision of controller 30, FPGA configuration circuitry 130 uses configuration data (which it may obtain from a source, such as a storage device, a host, etc., or during configuration switching of FPGA 103) to program or configure the functionality of FPGA 103. Configuration data are typically stored in CRAM 133. The contents of CRAM 133 determine the functionality of various blocks of FPGA 103, such as programmable logic 106 and programmable interconnect 109. The configuration data may be produced using a computer-aided (CAD) flow, as described below. In some embodiments, the configuration data may include information or data for multiple configurations. Alternatively, in some embodiments, controller 30 may use the initial configuration data for an initial configuration of FPGA 103, and produce one or more additional configurations based on the initial configuration. In exemplary embodiments, CRAM 133 may be included within configuration circuitry 130, may be a separate circuit block, or may be spread within FPGA 103.

Initialization circuit 139 may cause the performance of various functions at reset or power-up of FPGA 103. I/O circuitry 112 may constitute a wide variety of I/O devices or circuits. I/O circuitry 112 may couple to various parts of FPGA 103, for example, programmable logic 106 and programmable interconnect 109. I/O circuitry 112 provides a mechanism and circuitry for various blocks within FPGA 103 to communicate with external circuitry or devices. Test/debug circuitry 115 facilitates the testing and troubleshooting of various blocks and circuits within FPGA 103. Test/debug circuitry 115 may include a variety of blocks or circuits known to persons of ordinary skill in the art. For example, test/debug circuitry 115 may include circuits for performing tests after FPGA 103 powers up or resets, as desired. Test/debug circuitry 115 may also include coding and parity circuits, as desired.

FPGA 103 may include one or more processors 118. Processor 118 may couple to other blocks and circuits within FPGA 103. Processor 118 may receive data and information from circuits within or external to FPGA 103 and process the information in a wide variety of ways, as persons skilled in the art understand. One or more of processor(s) 118 may constitute a digital signal processor (DSP). DSPs allow performing a wide variety of signal processing tasks, such as compression, decompression, audio processing, video processing, filtering, and the like, as desired.

FPGA 103 may also include one or more communication circuit(s) 121. Communication circuit(s) 121 may facilitate data and information exchange between various circuits within FPGA 103 and circuits external to FPGA 103, as persons of ordinary skill in the art understand. Examples of communication circuit 121 include transceivers, network interface circuits, etc. FPGA 103 may further include one or more memories 124 and one or more memory controller(s) 127. Memory 124 allows the storage of various data and information (such as user-data, intermediate results, calculation results, etc.) within FPGA 103. Memory 124 may have a granular or block form, as desired. Memory controller 127 allows interfacing to, and controlling the operation and various functions of circuitry outside the FPGA. For example, memory controller 127 may interface to and control an external synchronous dynamic random access memory (SDRAM).

As noted, in some embodiments, the fabric or core of an FPGA may be allocated as circuit blocks corresponding to one or more configurations. The fabric or core of FPGA 103 may take a variety of forms. In some embodiments, the core circuitry of FPGA 103 includes, among other circuitry, programmable logic 106 and programmable interconnect 109. The programmable logic 106 and programmable interconnect 109 often reside within the FPGA in an array or regular structure, for example, a two-dimensional array. Thus, in some embodiments, the fabric or core of FPGA 103 may be arranged in rows and columns.

Figure 5:
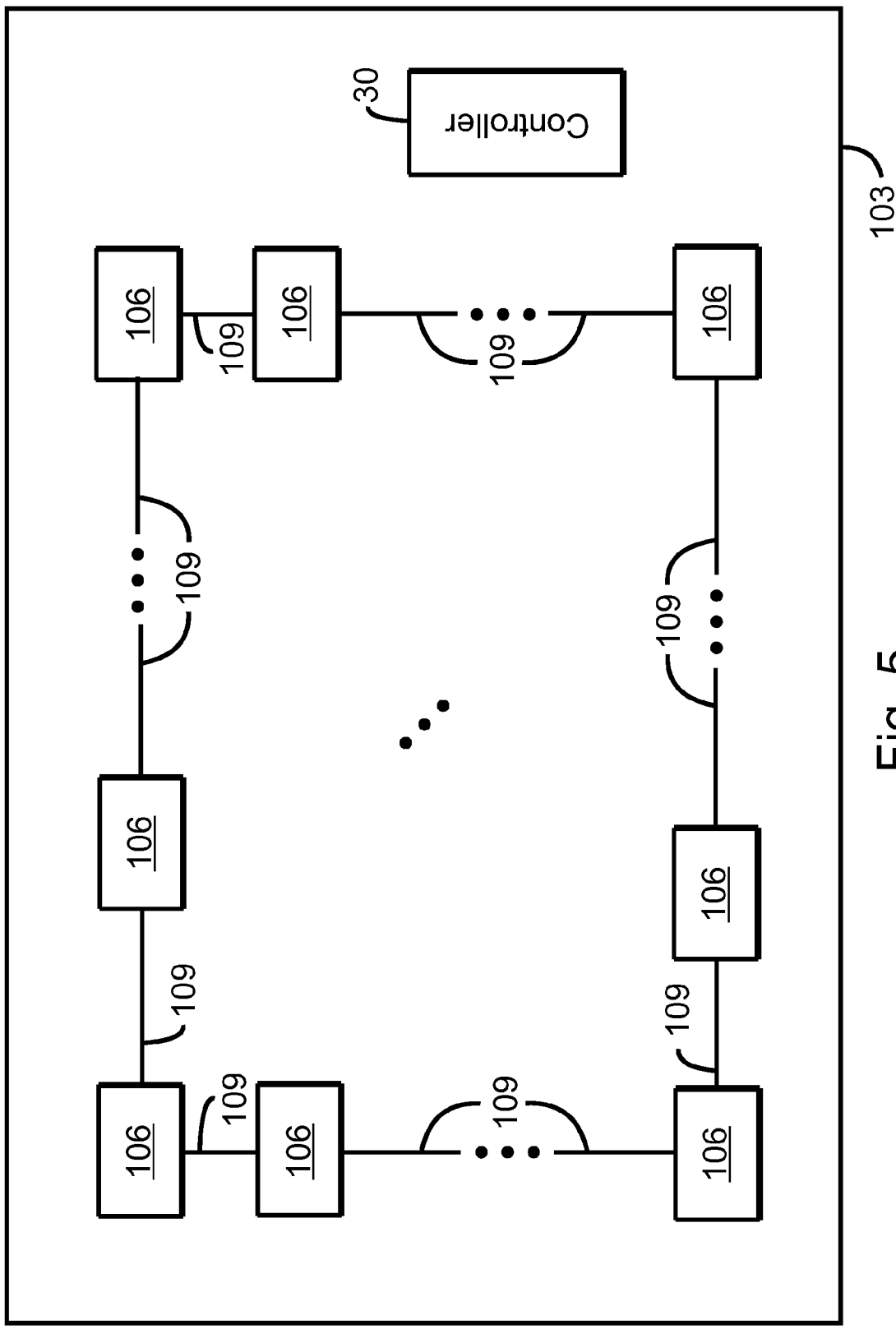
FIG. 5 depicts a floor-plan of an FPGA according to an exemplary embodiment.

FIG. 5 depicts a floor-plan of FPGA 103 according to an exemplary embodiment. FPGA 103 includes programmable logic 106 arranged as a two-dimensional array. Programmable interconnect 109, arranged as horizontal interconnect segments and vertical interconnect segments, couples the blocks of programmable logic 106 to one another. One may place the blocks in a particular manner so as to implement a user's design, as persons of ordinary skill in the art understand. A block, part of a block, or a set of blocks may constitute a tile or region of FPGA 103. FPGA 103 may thus include a number of tiles, arranged in a desired configuration (e.g., as two halves, four quadrants, etc.), as persons of ordinary skill in the art understand. In other embodiments, FPGA 103 may include rows and/or columns of circuitry or blocks of circuitry.

Figure 6:
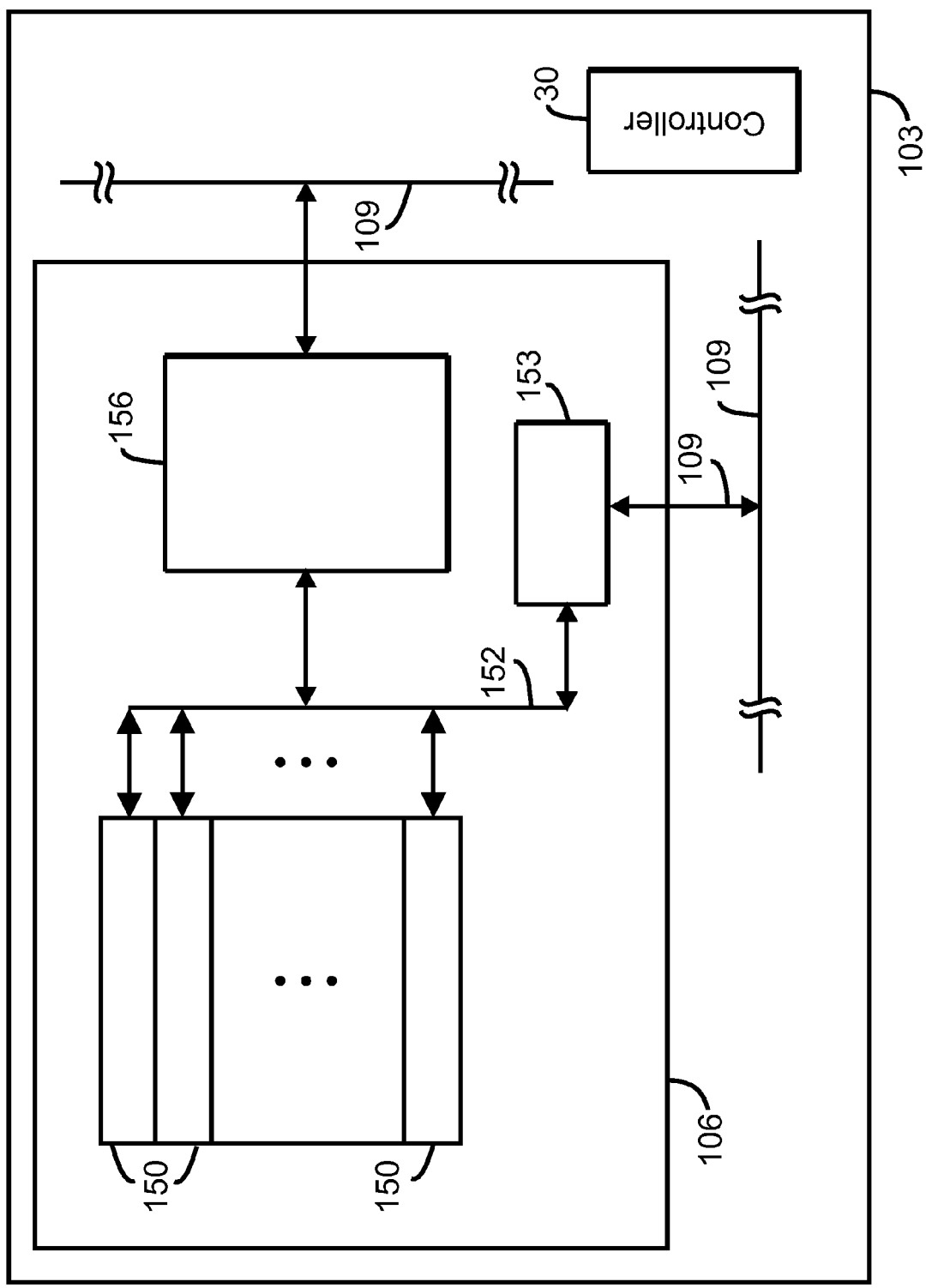
FIG. 6 depicts a block diagram of programmable logic and programmable interconnect in an FPGA according to an exemplary embodiment.

The core or fabric of FPGA 103 may include a more granular structure of programmable circuitry (e.g., programmable logic, programmable interconnect, etc.). FIG. 6 shows a block diagram of programmable logic 106 and programmable interconnect 109 in FPGA 103 according to an exemplary embodiment. In the exemplary embodiment shown, programmable logic 106 includes logic elements or programmable logic elements, circuits, or blocks 150, local interconnect 152, interface circuit 153, and interface circuit 156.

Logic elements 150 provide configurable or programmable logic functions, for example, LUTs, flip-flops, registers, product-term logic, etc., as persons of ordinary skill in the art understand. Local interconnect 152 provides a configurable or programmable mechanism for logic elements 150 to couple to one another or to programmable interconnect 109 (sometimes called "global interconnect"), as desired. Interface circuit 156 and interface circuit 159 provide a configurable or programmable way for programmable logic 106 block of circuitry to couple to programmable interconnect 109 (and hence to other programmable logic 106). Interface circuit 156 and interface circuit 159 may include MUXs, DEMUXs, registers, buffers, pass gates, drivers, and the like, as persons of ordinary skill in the art who have the benefit of the description of the invention understand. At a higher level, one may combine a number of logic elements 150 and associated circuitry to realize a larger programmable block. One may repeat this process as desired or appropriate in a given situation to generate programmable blocks of circuitry with a desired level of granularity of programmability.

Various circuits or blocks within FPGA 103 may be treated as circuit elements (e.g., as circuit elements 20 (see FIG. 1)) to be allocated to one or more configurations. In exemplary embodiments, a variety of levels of granularity for the allocation of circuit elements may be used. For example, in some embodiments, one may treat individual transistors (e.g., a transistor acting as a pass-gate) as a circuit element to be allocated to one or more configurations. As another example, consider the allocation of circuit elements in programmable logic 106. In some embodiments, a logic element (or a component or block within the logic element) or a set of logic elements may be allocated to one or more configurations. Other examples will be apparent to persons of ordinary skill in the art, for example, blocks of logic elements, tiles, quadrants, rows, columns, etc.

Similarly, various parts or blocks of circuitry within programmable interconnect 109 may be allocated to one or more configurations. For instance, one or more local interconnects may be allocated to one or more configurations. As another example, one or more global interconnects (or parts of one or more such interconnects) may allocated to one or more configurations. Other examples will be apparent to persons of ordinary skill in the art, depending on factors such as the architecture of the FPGA in question, the level of granularity of the FPGA's core or fabric, etc.

Referring to FIG. 4, in addition to or instead of programmable logic 106 and programmable interconnect 109, other circuits or blocks within FPGA 103 may be allocated to one or more configurations. For example, in some embodiments, memory 124 may be implemented as blocks of memory within FPGA 103. One or more blocks of memory within memory 124 may be allocated to one or more configurations. Similar possibilities exist with respect to processor(s) 118, communication circuit(s) 121, I/O circuitry 112, etc. Generally speaking, parts, or all, of one or more circuits or blocks of circuits in FPGA 103 may be allocated to one or more configurations that may be switched as described above to improve the reliability and/or life-span of FPGA 103.

Figure 7:
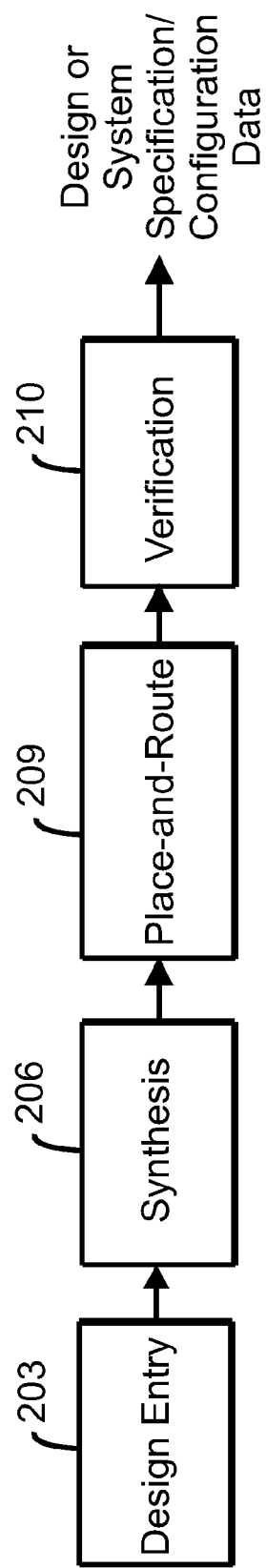
FIG. 7 illustrates an FPGA CAD flow according to an exemplary embodiment.

A variety of schemes for using multiple configurations in FPGA 103 are possible. One aspect of the disclosure relates to using an FPGA CAD flow or software to generate multiple configurations for FPGA 103. FIG. 7 illustrates an FPGA CAD flow according to an exemplary embodiment. The CAD flow includes design-entry module 203, synthesis module 206, place-and-route module 209, and verification module 210. Design-entry module 203 allows the editing of various design description files using graphical or textual descriptions of a circuit or its behavior, such as schematics, hardware description languages (HDL), or waveforms, as desired. The user may generate the design files by using design-entry module 203 or by using a variety of electronic design automation (EDA) or CAD tools (such as industry-standard EDA tools), as desired. The user may enter the design in a graphic format, a waveform-based format, a schematic format, in a text or binary format, or as a combination of those formats, as desired.

Synthesis module 206 accepts the output of design-entry module 203. Based on the user-provided design, synthesis module 206 generates appropriate logic circuitry that realizes the user-provided design. One or more FPGAs (not shown explicitly), such as FPGA 103 in FIG. 1, implement the synthesized overall design or system. Synthesis module 206 may also generate any glue logic that allows integration and proper operation and interfacing of various modules in the user's designs. For example, synthesis module 206 provides appropriate hardware so that an output of one block properly interfaces with an input of another block. Synthesis module 206 may provide appropriate hardware so as to meet the specifications of each of the modules in the overall design or system. Furthermore, synthesis module 206 may include algorithms and routines for optimizing the synthesized design. Through optimization, synthesis module 206 seeks to more efficiently use the resources of the one or more FPGAs that implement the overall design or system. Synthesis module 206 provides its output to place-and-route module 209. Following synthesis, one may include a technology mapping module (not shown in FIG. 7).

Place-and-route module 209 uses the designer's specifications, for example, timing specifications to perform optimal logic mapping and placement. The logic mapping and placement determine the use of logic resources within the FPGA(s). By using particular resources, such as programmable logic 106 and/or programmable interconnects within the FPGA(s) for certain parts of the design, place-and-route module 209 helps optimize the performance of the overall design or system. By the proper use of FPGA resources, place-and-route module 209 helps to meet the critical timing paths of the overall design or system. Place-and-route module 209 may also optimize the critical timing paths to help provide timing closure faster. As a result, the overall design or system can achieve faster performance (i.e., operate at a higher clock rate or have higher throughput).

Verification module 210 performs simulation and verification of the design. The simulation and verification seek in part to verify that the design complies with the user's prescribed specifications. The simulation and verification also aim at detecting and correcting any design problems before prototyping the design. Thus, verification module 210 helps the user to reduce the overall cost and time-to-market of the overall design or system. Verification module 210 may support and perform a variety of verification and simulation options, as desired. The options may include functional verification, test-bench generation, static timing analysis, timing simulation, hardware/software simulation, in-system verification, board-level timing analysis, signal integrity analysis and electro-magnetic compatibility (EMC), formal netlist verification, and the like. Note that one may perform other or additional verification techniques as desired. Furthermore, verification of the design may also be performed at other phases in the flow, as appropriate, and as desired.

The FPGA CAD flow, in particular place-and-route module 209, may be used to generate and/or manage the use of multiple configurations for FPGA 103. For example, in some embodiments, two or more complementary configurations may be used. Stated another way, the configurations are created such that none of the routing pass-gates (or transmission gates, MUXs, DEMUXs, etc.) used by one configuration are used by the other configuration(s). To do so, the user's design may first be mapped to one configuration, and the resources (pass-gates, transmission gates, MUXs, DEMUXs, etc.) used in (or selected for use in) that configuration may be marked or flagged. An additional (second) configuration may then be created with the restriction that it not use (or not use, if possible) any of the corresponding resources used by the first configuration.

In some embodiments, place-and-route module 209 may also include information, such as a count, that allows determining how recently a resource has been used. In this manner, place-and-route module 209 may select for use in a configuration those resources that have been used least recently and have therefore had more time to recover from the adverse phenomena described above.

Typically, a relatively small percentage of the routing resources are used in a user's design. Furthermore, a relatively small number of the pass-gates or pass transistors of routing MUXs are used (when the routing MUX is used in configuration). Consequently, this scheme would not impose a particularly severe constraint on routing the additional configuration(s). In some embodiments, place-and-route module 209 may be configured to deny (not allow) the use of routing resources or connections used previously by another configuration. As an alternative, place-and-route module 209 may be biased to avoid using resources previously used by one or more other configurations, if possible.

Figure 8:
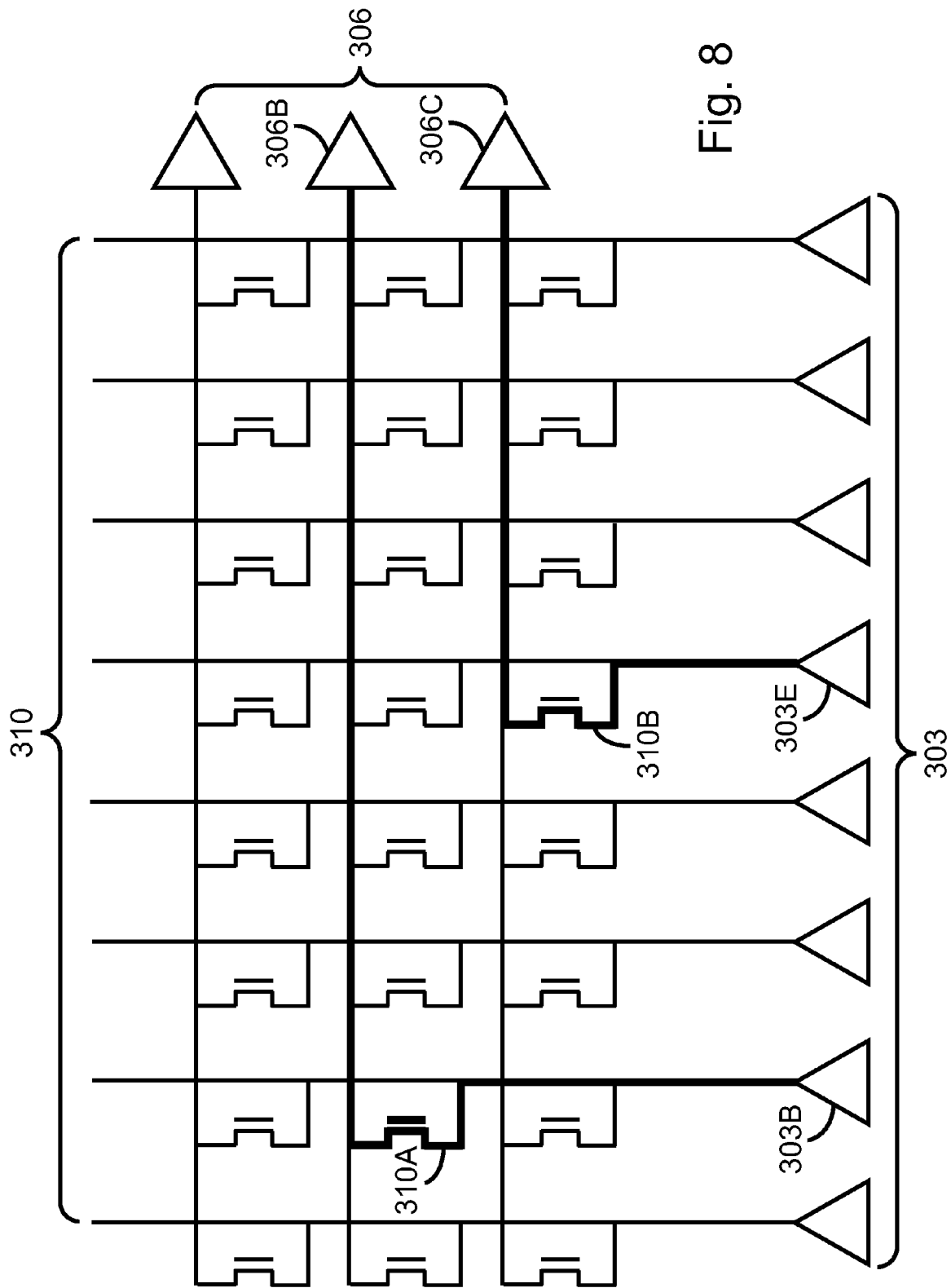
FIGS. 8-10 show an example of the use of FPGA resources by two configurations according to an exemplary embodiment.
Figure 9:
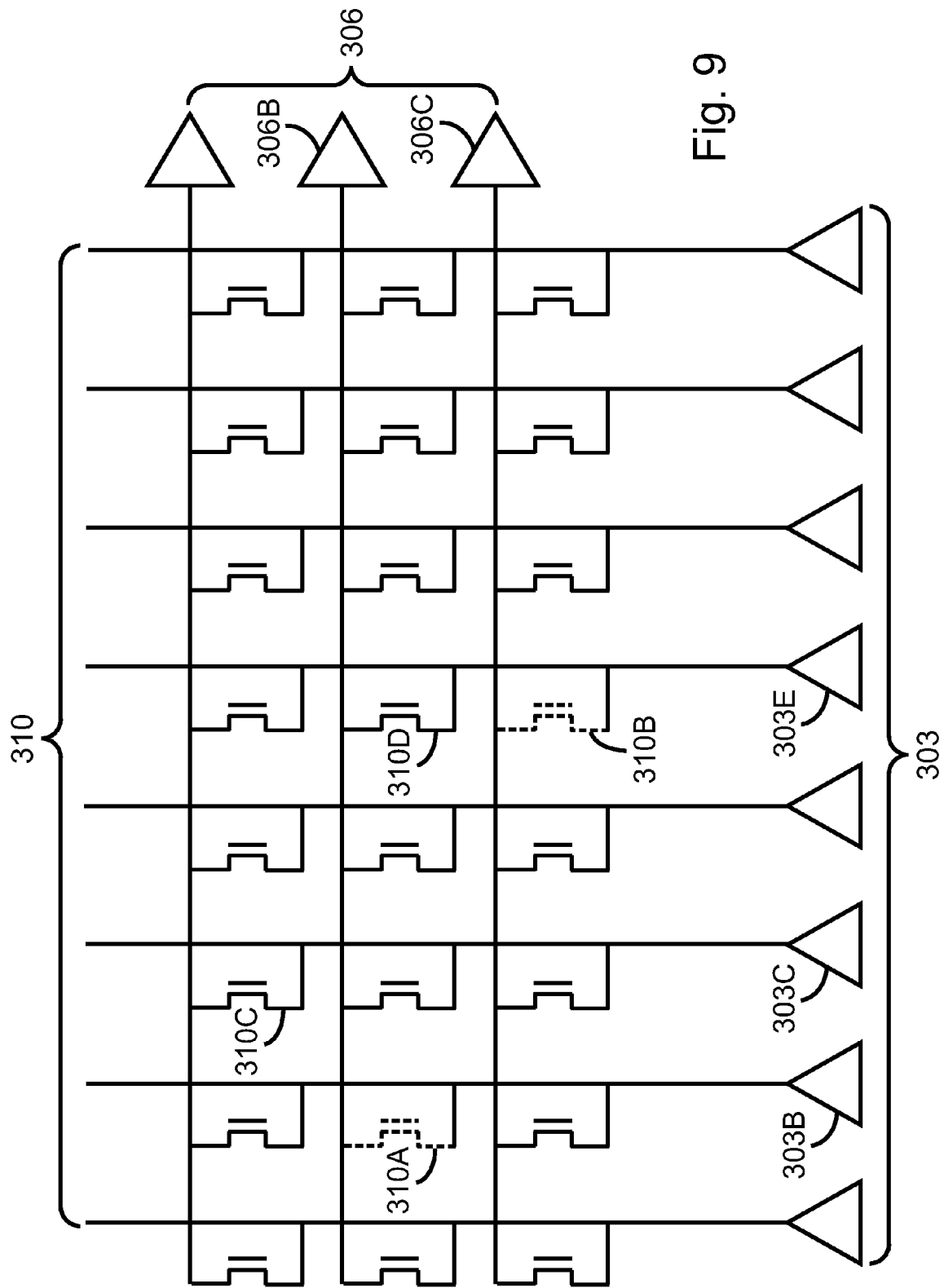
Figure 10:
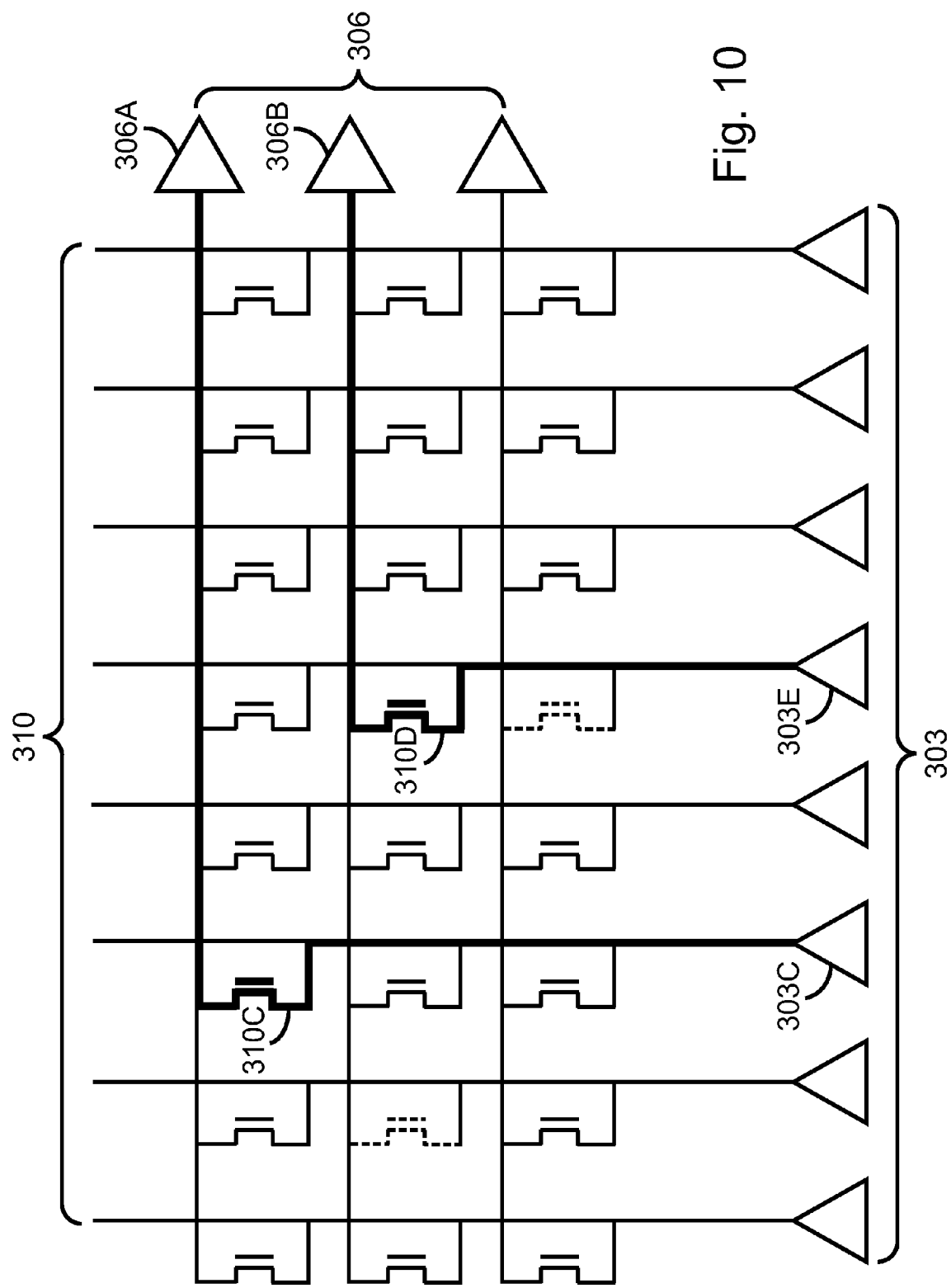

FIGS. 8-10 show an example of the use of FPGA resources by two configurations according to an exemplary embodiment. More specifically, FIGS. 8-10 correspond to the situation where place-and-route module 209 denies or avoids, if possible, the use of or access to routing resources or connections that have been used previously by another configuration. FIG. 8 shows a portion of the routing resources of FPGA 103. Input buffers 303 receive a plurality of signals and, using a number of pass-gates or pass transistors, route those signals to output buffers 306. The input signals may come from any desired source as specified by the synthesized user's design. Similarly, the output signals of buffers 306 may feed any desired destination.

Without loss of generality, suppose that the user's design specifies routing two signals. To do so, place-and-route module 209 may use a variety of resources in FPGA 103, for example, a plurality or pool of pass transistors 310, input buffers 303, and output buffers 306. When creating or generating one configuration (e.g., a first configuration for FPGA 103), place-and-route module 209 may for example use buffers 303B and 303E to receive the two signals from their respective sources, and use buffers 306B and 306C to provide the signals to their respective destinations. Thus, in the example shown, place-and-route module 209 routes the first signal by using pass transistor 310A to couple the output of buffer 303B to the input of buffer of 306B. Similarly, place-and-route module 209 routes the second signal by using pass transistor 310B to couple the output of buffer 303E to the input of buffer of 306C. Consequently, the first configuration (e.g., an initial configuration) of FPGA 103 uses buffers 303B, 303E, 306B, 306C, and pass transistors 310A and 310B for routing the two signals described above. Place-and-route module 209 marks buffers 303B, 303E, 306B, 306C, and pass transistors 310A and 310B as having been used in one configuration. This information (marking of circuit elements or components) may be saved, for example, in a persistent storage device like a disk, for future use (future run or activity) by place-and-route module 209.

To create another configuration (for example, a second configuration), place-and-route module 209 examines the pool of available routing resources. As shown in FIG. 9, in this example, buffers 303B, 303E, 306B, 306C and pass transistors 310A, 310B have been previously used. Accordingly, place-and-route module 209 denies or avoids their use, if possible. Suppose that one input buffer, labeled as 303C is unused and available, and two pass transistors, labeled as 310C and 310D in FIG. 9, are also available. Generally, place-and-route module 209 attempts to use circuit elements or generally resources that have not been previously used (or not been used recently). In the example shown in FIG. 9, suppose that only input buffers 303C and 303E are available. To route the two signals, place-and-route module 209 selects input buffer 303C and input buffer 303E, even though it has been used previously in a configuration. Place-and-route module 209 reuses input buffer 303E because, in this example, no other input buffer is available for use. Similarly, place-and-route module 209 selects output buffers 306B and 306C, because they are the two available output buffers for routing the two signals in the user's design. Finally, place-and-route module 209 selects pass transistors 310C, 310D to complete the routing of the two signals. FIG. 10 shows the resulting arrangement of routing resources for the additional or second configuration.

In some embodiments, one or more iterations of the routing of one or more configurations may be used to avoid or deny re-use of resources. For example, place-and-route module 209 may reroute one configuration after routing another configuration if the previous routing of resources for the configurations results in some resources being used by two or more configurations (e.g., in situations where it is desirable to avoid re-using resources by two or more configurations). As another example, place-and-route module 209 may be configured to avoid re-use (or use by more than configuration) of routing resources, but not other resources. Because routing resources tend to suffer more of the consequences of the adverse phenomena described above, place-and-route module 209 may route both configurations simultaneously, and allow more than one configuration to use resources in FPGA 103 other than routing resources.

Although routing resources in FPGAs tend to be the FPGA resources most susceptible to PBTI, NBTI, and other adverse effects, other resources in FPGA 103 may also be affected by those effects. In some embodiments, in addition to routing resources, place-and-route module 209 may also be configured to select other resources in FPGA 103, such as programmable logic 106, for inclusion in configurations so as to avoid their re-use. For example, a logic element (e.g., logic elements 150 in FIG. 6) in FPGA 103 may include a combinational LUT and a register. Either or both of the LUT and the register may be unused in a configuration. Place-and-route module 209 may be configured in some embodiments to preferentially use register(s) and/or LUT(s) in a configuration that have not been used in a previous configuration (or have been used less or least recently).

A similar technique may be applied to memory/memories 124 in FPGA 103. Typically, not all of the cells or locations in a memory 124 are used in a given configuration. Depending on factors such as the granularity of memory 124, when synthesizing the logic for another configuration, synthesis module 206 (see FIG. 7) may set the unused address bits to different values for two or more configurations, such that different memory bits are used by different configurations. Alternatively, depending on the granularity of memory 124, place-and-route module 209 may select memory locations or blocks for different configurations so as to avoid or prevent memory re-use (cause different memory locations or blocks to be used by different configurations).

A further aspect of the disclosure relates to creating configurations based on probabilities of signal values. Specifically, the probability of each node (or a set or subset of nodes) have logic 1 or logic 0 values may be computed (such probabilities are typically computed for various reasons, for example, estimating power consumption of FPGA circuitry). The user's design may then be synthesized (for example, using synthesis module 206 in FIG. 7) to increase or maximize the probability that any node in FPGA 103 that is used in two configurations has a relatively high probability of having a logic 1 value in one configuration and having a logic 0 value in the other configuration. Additionally, unused FPGA resources (e.g., unused programmable logic 106) in one configuration may be programmed such that the expected logic values of unused circuit nodes is opposite that of the expected logic values of those nodes when selected and programmed for use by another configuration. These are just a few examples of how different resources can be used (or preferentially used) in different implementations of the same design. A variety of other schemes may also be used, as persons of ordinary skill in the art understand.

Once two or more configurations have been created, FPGA 103 may switch between or among them in order to increase device reliability and/or longevity, as described above. FIG. 11 shows a circuit arrangement for providing configuration information to FPGA 103 according to an exemplary embodiment. A configuration device 403 (or other source of configuration information) contains or stores information for a number of configurations (generally m configurations, where m is a positive integer greater than unity). In the example shown in FIG. 11, configuration device 403 includes "Configuration 1," starting at hexadecimal address 0x00000000, and "Configuration 2," starting at hexadecimal address 0x80000000. FPGA 103 uses address lines 406 (or other, possibly serial-mode, control lines) to access the configuration information for a particular configuration. For example, to access "Configuration 1," FPGA 103 may provide hexadecimal address 0x00000000 to configuration device 403 via address lines 406. In response, configuration device 403 provides the information for the specified configuration to FPGA 103 via a configuration data line 412 (or a number of lines, for example, in a parallel-mode interface).

In addition, or alternatively, FPGA 103 may provide to configuration device 403 a number or value 409, denoted as N, that specifies the desired configuration to be retrieved, or an address, or both. Thus, in some embodiments, N might be provided as part of the address information, for example, as shown in FIG. 12, where N constitutes one bit of information to select between "Configuration 1" and "Configuration 2." In response, configuration device 403 provides information corresponding to the desired configuration via line(s) 412. Thus, N=0 causes configuration device 403 to provide information for "Configuration 1," whereas N=1 causes configuration device 403 to provide information for "Configuration 2." In some embodiments, the address information may be used to select or retrieve information for a configuration. In some embodiments, N may be used to select or retrieve information for a configuration.

A variety of other schemes and circuit arrangements are possible, as persons of ordinary skill in the art understand. For example, configuration information may be stored internally to FPGA 103, for example where FPGA 103 uses relatively small amounts of configuration information. Furthermore, other types of interface and control schemes and circuitry may be used, depending on factors such as end-use, system considerations, desired speed, flexibility, and the like.

FPGA 103 may switch configurations in a variety of ways. In some embodiments, FPGA 103 may switch configuration (e.g., from an initial configuration to second, third, fourth (or more) configurations) when it powers up or configures itself. For example, an internal flag or value, backed up by a battery back-up circuit, stored in non-volatile memory or storage, etc., may be toggled or changed when the device is configured or a configuration switching takes place. The value or flag may specify which configuration to use next. The value may increment (or decrement) in a circular fashion, i.e., the last value may increment (decrement) to the initial value, as desired.

As another example, configuration switching may be performed automatically, for example, every kth time (k denotes a positive integer) FPGA 103 is configured (e.g., when powered up), or when a previous configuration fails (e.g., because of the adverse phenomena described above), etc. FPGA 103 may toggle or switch between configurations until one or more failures are detected in one of the configurations, at which point that configuration might be marked as "do not use." This scheme would prevent reuse of that configuration. Alternatively, in response to a configuration failure, a move may be made to the next configuration (or another configuration) and ignore the failed configuration for the next n cycles (n denotes a positive integer), after which time the failed configuration may be tried. This scheme would be useful, for example, if the built-in self-test sometimes flags an error for reasons other than device wear-out (since the configuration where the fault was detected would eventually be retried, but would not do so as frequently as every other configuration). As yet another example, a configuration may be used until it causes a failure in the user's design, at which point a switch may be made to another configuration. (Failures in the user's design may typically be detected by self-test circuitry implemented internally to FPGA 103, or externally, for example, as system-wide error-detection circuitry.) As another example, an input to configuration circuitry 130 (see FIG. 4) may be asserted by the user, which would cause a configuration selection value to change or toggle. As yet another example, in some embodiments, the switching between configurations may be initiated by the FPGA user through custom circuitry coupled to FPGA 103. In one embodiment, a configuration may be used until a predetermined period of time, which may be user selectable, has passed, at which point a switch may be made to another configuration.

As noted above, the circuitry (e.g., control circuitry or controller) for determining which configuration should be used or loaded at a given time may reside outside FPGA 103. For example, such determinations may be made externally to FPGA 103, for instance by the user, by an external system running software on a processor, and the like. In some embodiments, FPGA 103 may be a slave to another device. In this situation, the configuration data may be "pushed" onto or communicated to FPGA 103 by external circuitry (in which case FPGA 103 may not provide the address information described above).

According to one aspect of the disclosed concepts, algorithms, methods, flows, or software may be designed and implemented that correspond to various apparatus embodiments, such as those described above, or to a combination of apparatus and method, such as firmware. In one exemplary embodiment, a method includes operating an IC in a first configuration by using a first set of circuit elements allocated to the first configuration, and operating the IC in a second configuration by using a second set of circuit elements allocated to the second configuration. Operating the IC in the first configuration followed by operating the IC in the second configuration according to the method improves the reliability of the IC. In another exemplary embodiment, a method of configuring an IC includes allocating a first set of circuit elements to a first configuration of the IC, and allocating a second set of circuit elements to a second configuration of the IC. The method further includes configuring the IC so that the first configuration of the IC is switched to the second configuration of the IC so as to improve the reliability of the IC.

Figure 13:
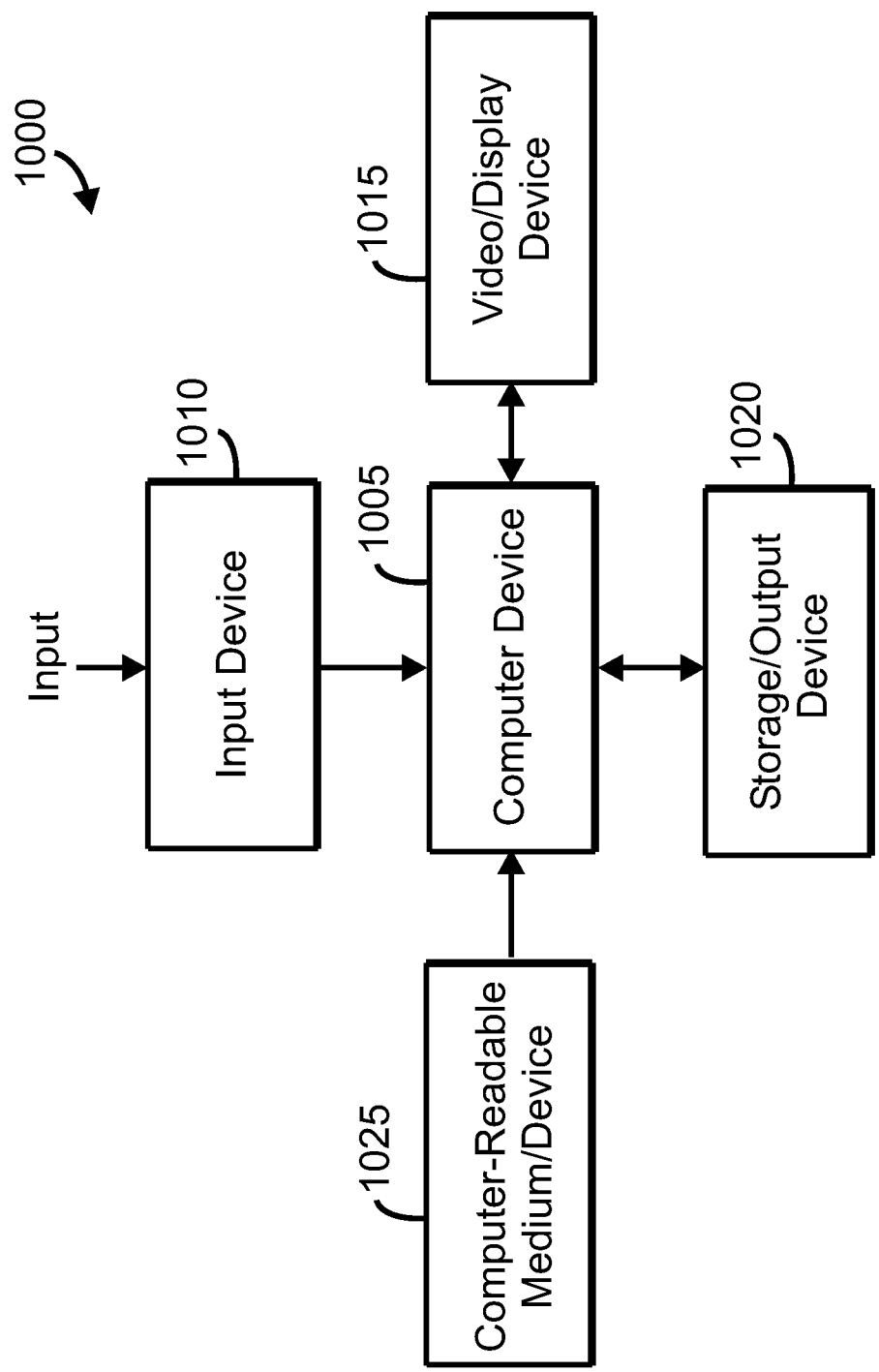
FIG. 13 depicts a block diagram of an exemplary system for information processing according to the disclosed concepts.

According to one aspect of the disclosed concepts, one may perform, run, or execute the disclosed algorithms, methods, flows, or software on computer systems, devices, processors, controllers, etc. FIG. 13 shows a block diagram of an exemplary system 1000 for processing information according to the disclosed concepts. System 1000 includes a computer device 1005, an input device 1010, a video/display device 1015, and a storage/output device 1020, although one may include more than one of each of those devices, as desired.

Computer device 1005 couples to input device 1010, video/display device 1015, and storage/output device 1020. System 1000 may include more than one computer device 1005, for example, a set of associated computer devices or systems, as desired.

Typically, system 1000 operates in association with input from a user. The user input typically causes system 1000 to perform information-processing tasks, such as the disclosed information-processing tasks, including creation of configurations, selection of circuit elements, etc. System 1000 in part uses computer device 1005 to perform those tasks. Computer device 1005 includes information-processing circuitry, such as a central-processing unit (CPU), controller, microcontroller, etc., although one may use more than one such device or information-processing circuitry, as persons skilled in the art would understand.

Input device 1010 receives input from the user and makes that input available to computer device 1005 for processing. The user input may include data, instructions, or both, as desired. Input device 1010 may constitute an alphanumeric input device (e.g., a keyboard), a pointing device (e.g., a mouse, roller-ball, light pen, touch-sensitive apparatus, for example, a touch-sensitive display, or tablet), or both. The user operates the alphanumeric keyboard to provide text, such as ASCII characters, to computer device 1005. Similarly, the user operates the pointing device to provide cursor position or control information to computer device 1005.

Video/display device 1015 displays visual images to the user. Video/display device 1015 may include graphics circuitry, such as graphics processors, as desired. The visual images may include information about the operation of computer device 1005, such as graphs, pictures, images, and text. Video/display device 1015 may include a computer monitor or display, a projection device, and the like, as persons of ordinary skill in the art would understand. If system 1000 uses a touch-sensitive display, the display may also operate to provide user input to computer device 1005.

Storage/output device 1020 allows computer device 1005 to store information for additional processing or later retrieval (e.g., softcopy), to present information in various forms (e.g., hardcopy), or both. As an example, storage/output device 1020 may include a magnetic, optical, semiconductor, or magneto-optical drive capable of storing information on a desired medium and in a desired format. As another example, storage/output device 1020 may constitute a printer, plotter, or other output device to generate printed or plotted expressions of the information from computer device 1005.

Computer-readable medium 1025 interrelates structurally and functionally to computer device 1005. Computer-readable medium 1025 stores, encodes, records, and/or embodies functional descriptive material. By way of illustration, the functional descriptive material may include computer programs, computer code, computer applications, and/or information structures (e.g., data structures or file systems). When stored, encoded, recorded, and/or embodied by computer-readable medium 1025, the functional descriptive material imparts functionality. The functional descriptive material interrelates to computer-readable medium 1025.

Information structures within the functional descriptive material define structural and functional interrelations between the information structures and computer-readable medium 1025 and/or other aspects of system 1000. These interrelations permit the realization of the information structures' functionality.

Moreover, within such functional descriptive material, computer programs define structural and functional interrelations between the computer programs and computer-readable medium 1025 and other aspects of system 1000. These interrelations permit the realization of the computer programs' functionality. Thus, in a general sense, computer-readable medium 1025 includes information, such as instructions, that when executed by computer device 1005, cause computer device 1005 (system 1000, generally) to provide the functionality prescribed by a computer program, software, method, algorithm, etc., as included (partially or entirely) in computer-readable medium 1025.

By way of illustration, computer device 1005 reads, accesses, or copies functional descriptive material into a computer memory (not shown explicitly in the figure) of computer device 1005. Computer device 1005 performs operations in response to the material present in the computer memory. Computer device 1005 may perform the operations of processing a computer application that causes computer device 1005 to perform additional operations. Accordingly, the functional descriptive material exhibits a functional interrelation with the way computer device 1005 executes processes and performs operations.

Furthermore, computer-readable medium 1025 constitutes an apparatus from which computer device 1005 may access computer information, programs, code, and/or applications. Computer device 1005 may process the information, programs, code, and/or applications that cause computer device 1005 to perform additional or desired tasks or operations.

Note that one may implement computer-readable medium 1025 in a variety of ways, as persons of ordinary skill in the art would understand. For example, memory within computer device 1005 may constitute a computer-readable medium 1025, as desired.

Alternatively, computer-readable medium 1025 may include a set of associated, interrelated, coupled (e.g., through conductors, fibers, etc.), or networked computer-readable media, for example, when computer device 1005 receives the functional descriptive material from a network of computer devices or information-processing systems. Note that computer device 1005 may receive the functional descriptive material from computer-readable medium 1025, the network, or both, as desired.

Although the above disclosure in part discusses techniques and circuitry for improving the reliability and/or life-spans of FPGA, the disclosed concepts apply generally to ICs with programmable or configurable circuitry. Such ICs may be known to persons of ordinary skill in the art as programmable logic devices (PLDs), complex PLDs (CPLDs), and the like.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art understand. Other modifications and alternative embodiments in addition to those described here will be apparent to persons of ordinary skill in the art. Accordingly, this description teaches those skilled in the art the manner of carrying out the disclosed concepts, and is to be construed as illustrative only.

The forms and embodiments shown and described should be taken as illustrative embodiments. Persons skilled in the art may make various changes in the shape, size and arrangement of parts without departing from the scope of the disclosed concepts in this document. For example, persons skilled in the art may substitute equivalent elements for the elements illustrated and described here. Moreover, persons skilled in the art who have the benefit of this disclosure may use certain features of the disclosed concepts independently of the use of other features, without departing from the scope of the disclosed concepts.

The invention claimed is:

1. An apparatus comprising:
a first set of circuit elements to perform a first logic function in a first configuration of the apparatus; and
a second set of circuit elements to perform a second logic function in a second configuration of the apparatus, wherein the first configuration of the apparatus is switched to the second configuration of the apparatus in order to improve reliability of the apparatus by reducing an effect of bias temperature instability, wherein the first and second sets of circuit elements are non-overlapping, and wherein the first logic function in different from the second logic function.

2. The apparatus according to claim 1, wherein the first configuration of the apparatus is switched to the second configuration of the apparatus to reduce an effect of negative bias temperature instability (NBTI) and/or positive bias temperature instability (PBTI).

3. The apparatus according to claim 1, wherein the first configuration of the apparatus is switched to the second configuration of the apparatus to reduce an effect of stress on at least a part of the apparatus.

4. The apparatus according to claim 1 further comprising a controller adapted to allocate the first set of circuit elements to the first configuration and to allocate the second set of circuit elements to the second configuration.

5. The apparatus according to claim 4, wherein the controller is adapted to allocate the first and second sets of circuit elements such that the first and second set of circuit elements are non-overlapping.

6. The apparatus according to claim 4, wherein the controller is adapted to switch the first configuration of the apparatus to the second configuration of the apparatus.

7. The apparatus according to claim 6, wherein the controller is adapted to switch the first configuration of the apparatus to the second configuration of the apparatus by deactivating the first set of the circuit elements and by activating the second set of circuit elements.

8. The apparatus according to claim 4, wherein the apparatus is adapted to be operated in the first configuration for a first period of time before the apparatus is switched to the second configuration.

9. The apparatus according to claim 8, wherein the apparatus is adapted to be operated in the second configuration for a second period of time before the apparatus is switched back to the first configuration.

10. The apparatus according to claim 1 further comprising at least one or more additional sets of circuit elements used in one or more additional corresponding configurations of the apparatus, wherein the first configuration of the apparatus is switched to the second configuration of the apparatus, and wherein the second configuration of the apparatus is thereafter switched to one or more of the additional corresponding configurations of the apparatus.

11. The apparatus according to claim 1, wherein at least one of the first and second sets of circuit elements comprises programmable logic and/or programmable interconnect.

12. The apparatus according to claim 1, wherein at least one of the first and second sets of circuit elements comprises routing circuitry.

13. A method comprising:
operating an integrated circuit (IC) in a first configuration by using a first set of circuit elements allocated to the first configuration, the first set of circuit element performing a first logic function; and
operating the IC in a second configuration by using a second set of circuit elements allocated to the second configuration, the second set of circuit element performing a second logic function, wherein operating the IC in the first configuration followed by operating the IC in the second configuration improves reliability of the IC by reducing an effect of bias temperature instability, wherein the first and second sets of circuit elements are non-overlapping, and wherein the first and second logic function are different.

14. The method according to claim 13, wherein operating the IC in the first configuration further comprises activating the first set of circuit elements.

15. The method according to claim 14, wherein operating the IC in the second configuration further comprises inactivating the first set of circuit elements, and activating the second set of circuit elements.

16. The method according to claim 13, wherein operating the IC in the first configuration further comprises using the first set of circuit elements for a first period of time, and wherein operating the IC in the second configuration further comprises using the second set of circuit elements for a second period of time.

17. The method according to claim 13, wherein a duration of the first period of time is selected so as to allow the first set of circuit elements to recover from an effect of negative bias temperature instability (NBTI) and/or positive bias temperature instability (PBTI), and wherein a duration of the second period of time is selected so as to allow the second set of circuit elements to recover from an effect of NBTI and/or PBTI.

18. The method according to claim 13, wherein the first and second periods of time are selected so as to allow the first and second sets of circuit elements, respectively, to recover from an effect of stress.

19. A method of configuring an integrated circuit (IC), the method comprising:
  allocating a first set of circuit elements to perform a first logic function in a first configuration of the IC;
  allocating a second set of circuit elements to perform a second logic function in a second configuration of the IC; wherein the first and second set of circuit elements are allocated such that the first and second set of circuit elements are non-overlapping and wherein the first logic function is different from the second logic function; and
  configuring the IC so that the first configuration of the IC is switched to the second configuration of the IC so as to improve reliability of the IC by reducing an effect of bias temperature instability.

20. The method according to claim 19, wherein configuring the IC further comprises configuring the IC so that the first configuration of the IC is switched to the second configuration of the IC after the IC has used the first configuration for a first period of time.

21. The method according to claim 20 further comprising configuring the IC so that the second configuration of the IC is switched to the first configuration of the IC after the IC has used the second configuration for a second period of time.

22. The method according to claim 21 further comprising selecting the first period of time to have a sufficient length to allow the first set of circuit elements to recover, and selecting the second period of time to have a sufficient length to allow the second set of circuit elements to recover.

23. The method according to claim 19, wherein allocating the first set of circuit elements further comprises allocating programmable logic and/or programmable interconnect to the first configuration of the IC, and wherein allocating the second set of circuit elements further comprises allocating programmable logic and/or programmable interconnect to the second configuration of the IC.

24. The method according to claim 19, wherein the first and second set of circuit elements are allocated such that, rather than being non-overlapping, the first and second set of circuit elements are at least partially overlapping.

* * * * *